United States Patent
Jeong et al.

(10) Patent No.: US 6,596,965 B2
(45) Date of Patent: Jul. 22, 2003

(54) METHOD AND APPARATUS FOR MARKING AN IDENTIFICATION MARK ON A WAFER

(75) Inventors: Sil-Gun Jeong, Gyeonggi-do (KR); Kyoung-Shin Park, Gyeonggi-do (KR); Hi-Youn Cho, Gyeonggi-do (KR); Byeong-Cheol Park, Gyeonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/941,848

(22) Filed: Aug. 30, 2001

(65) Prior Publication Data

US 2002/0092836 A1 Jul. 18, 2002

(30) Foreign Application Priority Data

Sep. 6, 2000 (KR) .......................................... 2000-52609

(51) Int. Cl.[7] .............................................. B23K 26/00
(52) U.S. Cl. ............................. 219/121.68; 219/121.84
(58) Field of Search .......................... 219/121.6, 121.65, 219/121.66, 121.68, 121.69, 121.83, 121.84, 121.85

(56) References Cited

U.S. PATENT DOCUMENTS 6,156,676 A * 12/2000 Sato et al.
6,426,478 B2 * 7/2002 Yoo

FOREIGN PATENT DOCUMENTS

JP 402205682 A * 8/1990
WO WO98/42474 10/1998

* cited by examiner

Primary Examiner—Samuel M. Heinrich
(74) Attorney, Agent, or Firm—Volentine Francos, PLLC

(57) ABSTRACT

A method and an apparatus for marking an identification mark on a wafer. After the wafer is aligned, a laser beam is radiated onto a predetermined portion on the wafer so that the identification mark is engraved on the wafer. While the laser beam is being radiated, a gas blows towards the predetermined portion on the wafer so as to remove the particles which are created on the surface on the wafer caused by the radiation of the laser beam. A collecting and exhausting section is provided to collect and exhaust the gas that is mixed with the particles.

19 Claims, 5 Drawing Sheets

METHOD AND APPARATUS FOR MARKING AN IDENTIFICATION MARK ON A WAFER

BACKGROUND OF THE INVENTION

1. Field of the Invention

The present invention relates to a method and an apparatus for marking an identification mark on a wafer, and more particularly, to a method for marking an identification mark to identify wafers by radiating a laser beam onto a predetermined portion on the wafer and an apparatus for performing the method.

2. Description of the Related Art

The elements of a semiconductor device are becoming more densely integrated to improve the processing speed and increase the memory capacity. A semiconductor device is generally manufactured by forming a multi-layer structure, including dielectric layers and conductive layers, through a sequence of film forming, pattern forming, and etching processes.

Among the many types of semiconductor devices, a MOS (metal oxide semiconductor) transistor is fabricated as follows. First, a wafer is divided into an active area and a field area on the basis of unit chips defined on the wafer. Then, a gate electrode and source/drain electrodes are formed in the active area. After an insulation layer is formed on the gate electrode, the insulation layer is etched so that a contact hole is formed for partially opening a surface portion of the wafer, where the source/drain electrodes are positioned. Then, a conductive layer is deposited in the contact hole and on the insulation layer. Thereafter, a predetermined portion of the conductive layer is etched so as to form a wiring pattern. A passivation layer is formed on the conductive layer, and a predetermined portion of the passivation layer is etched so as to define a connecting section for connecting the wiring to an external terminal.

Thereafter, the wafer is inspected for defects. If there are no defects, the wafer is cut into unit chips and a packaging process is implemented to complete the semiconductor device fabrication process.

It is important that the semiconductor device be fabricated by sequentially performing the unit processes in a predetermined order. If the unit processes are carried out in the wrong order, a failure or serious problem is likely to result, causing defects or degraded performance in the semiconductor device. Accordingly, the fabrication process must include a mechanism or process for checking the order of the unit processes when the wafer is fabricated. Identification marks are widely used, and they are marked onto a predetermined portion of the wafer to identify the wafer and allow operators to check the order of the unit processes. The identification mark is checked either by the operator or by an optical reader which may be conveyed to the operator. Since each unit process is carried out simultaneously with respect to twenty-five unit devices as one lot, the identification mark is also prepared on the basis of one lot of wafers.

Examples of identification marks are disclosed in U.S. Pat. No. 5,877,064 issued to Chang et al, and U.S. Pat. No. 5,956,596, issued to Jang et. al, U.S. Pat. No. 5,999,252, issued to Greisz, U.S. Pat. No. 6,004,405, issued to Oishi et. al, and U.S. Pat. No. 6,051,845, issued to Uritsky.

The identification mark is generally engraved on the wafer before the wafer is subjected to the unit processes, mainly by means of a laser beam. The identification mark is engraved onto a predetermined portion on the wafer by radiating the laser beam onto the predetermined portion on the wafer.

However, when the identification mark is engraved on the wafer by radiating the laser beam, contaminating particles may be created because the laser beam melts the surface of the wafer to create the mark. Accordingly, the wafer having the contaminating particles is subjected to the unit processes, which increases the likelihood of defects being generated during the processing steps.

In order to solve the above problem, U.S. Pat. No. 5,877,064 ('064) discloses a method for reducing the particles. According to the '064 method, an identification mark is engraved at a bottom surface of a wafer, after the bottom surface has an oxide film formed thereon. A laser beam is radiated onto a predetermined portion of the bottom surface of the wafer, and the oxide film is then removed for obtaining the identification mark. However, though the above method can reduce the contaminating particles on the active surface of the wafer, since the identification mark is engraved at the bottom surface of the wafer, it is difficult to easily check the identification mark. In addition, the above method requires the formation and removal of an oxide film in order to obtain the identification mark, thereby adding costs, complexity and processing time to the manufacturing process.

SUMMARY OF THE INVENTION

In order to overcome the shortcomings of the prior art, it is an object of the present invention to provide a method for marking an identification mark on a wafer by radiating a laser beam, and thereafter easily removing any contaminating particles created during the marking process.

A second object of the present invention is to provide an apparatus for marking an identification mark on a wafer by radiating a laser beam, and thereafter easily removing any contaminating particles created during the marking process.

To achieve the first object of the present invention, there is provided a method for marking an identification mark on a wafer including engraving a wafer identification mark onto a predetermined portion of the wafer by radiating a laser beam onto the predetermined portion of the wafer. While the laser beam is being radiated, a gas is blown towards the predetermined portion of the wafer so as to blow particles away from the surface of the wafer, which particles were created on the surface of the wafer by radiating the laser beam. The gas, which is now mixed with the particles generated during the engraving process, is continually collected and exhausted during the engraving and blowing steps.

The predetermined portion of the wafer may be the flat zone of the wafer or a peripheral portion of the wafer where no patterns are formed. The laser beam is thus radiated onto the flat zone or the peripheral portion of the wafer so as to engrave the identification mark thereon. The laser beam is generated by means of an Nd/YAG laser operated in a dot matrix mode having a wavelength of 1064 nm. The Nd/YAG laser is widely used in various manufacturing industries.

The gas blows towards the wafer simultaneously with the radiation of the laser beam and keeps blowing after the radiation of the layer beam has been deactivated. Preferably, the gas keeps blowing for about 3 seconds after the radiation of the laser beam has been deactivated. The gas includes air, nitrogen gas, or a mixture thereof, and is blown onto the surface of the wafer at a oblique angle, preferably 20 to 40 degrees.

To achieve the second object of the present invention, there is provided an apparatus for marking a wafer identification mark on a wafer. The apparatus includes a supporting section for receiving and supporting the wafer, and a laser beam radiating section for engraving the wafer identification mark onto a predetermined portion of the wafer to identify the wafer. A blowing section has one end positioned adjacent to the wafer, and blows gas in a flow direction towards the predetermined portion of the wafer while the laser beam is being radiated so as to remove particles created on the surface of the wafer by radiating the laser beam.

The end of the blowing section comprises a nozzle oriented along the flow direction and positioned at an oblique angle relative to the surface of the wafer, wherein the gas flows though the nozzle and toward the surface of the wafer at an oblique angle of about 20 to 40 degrees.

A collecting and exhausting section, which is positioned adjacent to the surface of the wafer and confronts the flow direction of the blowing section, collects and exhausts the gas including the particles while the laser beam is being radiated. One end of the collecting and exhausting section has a cone-shaped end portion which is positioned adjacent to the surface of the wafer, and the other end comprises a suction member (e.g., a fan), providing a suction force for forcibly exhausting the gas.

A control section is electrically connected to the laser radiating section and the blowing section. The blowing section further includes a solenoid valve for activating and deactivating the blowing of the gas. The control section operatively receives intensity data corresponding to a power applied to the laser beam radiating section, and the control section controls the activating and deactivating states of the solenoid valve based on the intensity data of the power. The solenoid valve is activated when the power is applied to the laser beam radiating section and is deactivated after a predetermined times lapses (e.g., 3 seconds) after the power applied to the laser beam radiating section is deactivated.

By using a marking apparatus and method as described above, particles created on the surface of the wafer can be effectively removed. Accordingly, the particles are prevented from sticking onto the surface on the wafer, so not only is the marking process performed in a stable manner, but also the failure of the device caused by the particles is prevented while subsequent processes are being performed.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
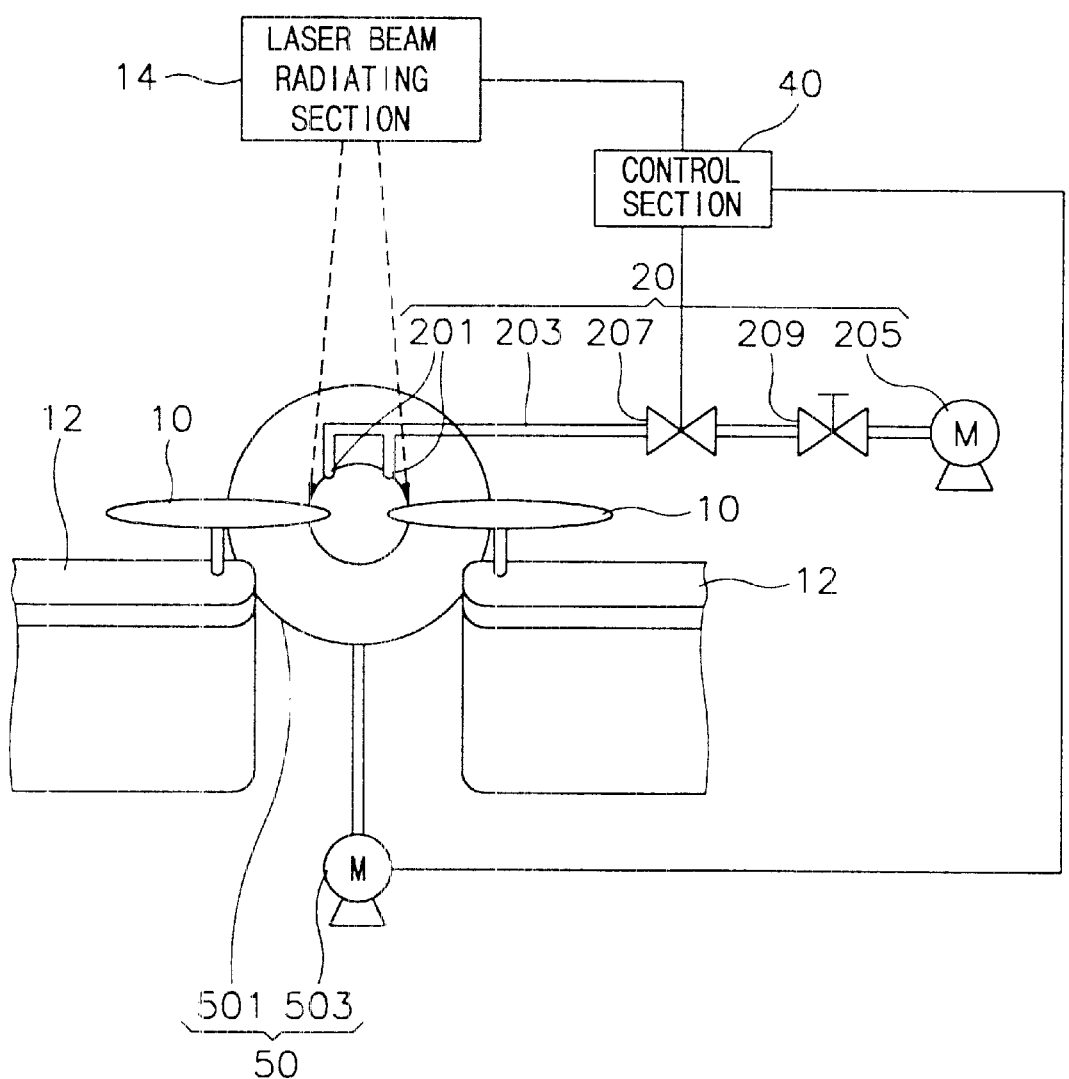
FIG. 1 is a schematic diagram showing an apparatus for marking an identification mark on a wafer according to an embodiment of the present invention.

The present invention now will be described more fully with reference to the accompanying drawings, in which preferred embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIG. 1 shows an apparatus for marking an identification mark on a wafer according to an embodiment of the present invention. In FIG. 1, a dual type marking apparatus is provided to mark the identification mark on two wafers simultaneously, although it is understood that the principles of the present invention apply to marking one or more wafers.

Wafers 10 are placed on supporters 12. The supporters 12 receive the wafers 10 from a conveying member (not shown), for example an articulate robot arm. In addition, the supporters 12 include a spin chuck which receives the wafer 10 and defines a marking area on the wafer 10, where the identification mark is engraved, by rotating and aligning the wafer 10.

A laser beam radiating section 14 is provided to radiate the laser beam onto the predetermined portion (i.e., marking area) of the wafer 10 supported by the supporter 12, to thereby engrave the identification mark onto the predetermined portion of the wafer 10. A dot matrix mode Nd/YAG laser is used as the laser beam radiating section 14, for example. Accordingly, a dot matrix type identification mark is engraved on the wafer 10. The laser has a wavelength of 1064 nm. Other suitable lasers could be employed, depending on the desired mark type.

Since the identification mark is engraved by forming a series of dots (i.e., pits in the wafer surface), contaminating particles are created. That is, the identification mark is engraved on the wafer 10 by melting the surface of the wafer 10 using the laser beam and thus contaminating particles are generated, which stick to the surface of the wafer. Moreover, since the radiation of the laser beam is continuously carried out for a predetermined time, the particles are also continuously generated. The contaminating particles sticking to the surface of the wafer 10 cause defects which induce failures when subsequent device fabrication processes are carried out. To ensure reliability and enhance the yield of semiconductor devices, these contaminating particles must be removed from the surface on the wafer 10 while the marking process is being carried out.

For this reason, a blowing section 20 is provided in the present embodiment. One end of the blowing section 20 is positioned adjacent to the surface of the wafer 10 so as to blow gas in a flow direction towards and along the surface of the wafer 10. The blowing section 20 blows the gas towards the predetermined portion on the wafer 10 where the identification mark is being engraved. The blowing section 20 includes nozzles 201, valves 207 and 209, a pipe 203 and a blowing motor 205. Since two wafers 10 are simultaneously marked, two nozzles 201 are preferably provided, although greater or fewer nozzles may be employed within the context of the present invention.

Figure 2:
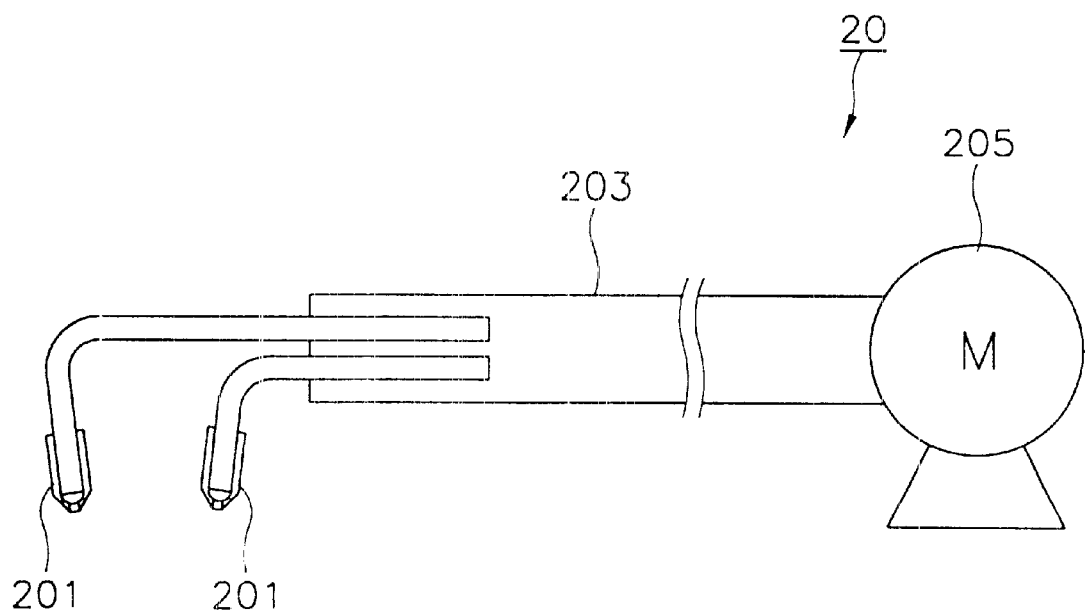
FIG. 2 is a top schematic view showing a blowing section of the apparatus shown in FIG. 1 in greater detail.

FIG. 2 is a top schematic view illustrating the blowing section 20 in greater detail. In FIG. 2, the nozzles 201, the pipe 203 and the blowing motor 205 are provided in the blowing section 20. Two nozzles 201 are connected via the pipe 203 to the blowing motor 205 so as to blow the gas towards two wafers 10. The one end of the blowing section 20 containing the nozzles 201 is positioned adjacent to the surface of the wafers 10. The blowing force generated from the blowing motor 205 is supplied to the nozzles 201 so that the gas blows towards the surface of the wafers 10.

Figure 3:
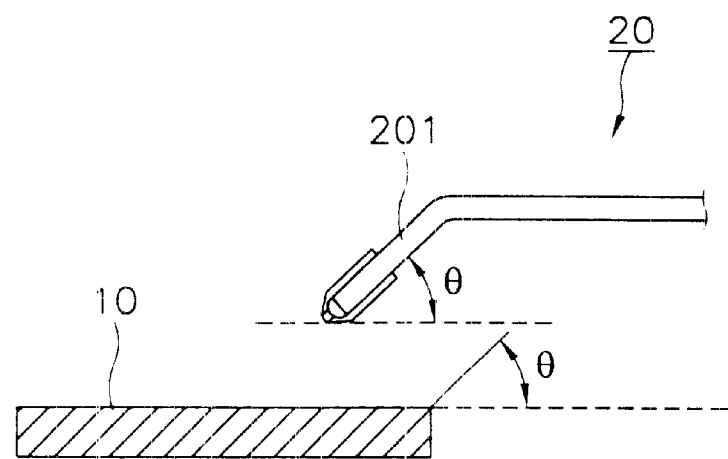
FIG. 3 is a side detailed view showing one end of the blowing section of FIG. 2 and the vertical positioning of one of the nozzles of the blowing section in relation to the surface of the wafer.

FIG. 3 is a side detailed view of one end of the blowing section 20 showing the vertical positioning of one of the nozzles 201 in relation to the surface of the wafer 10. In FIG. 3, the nozzle 201 is obliquely installed with respect to the surface of the wafer 10 so as to blow the gas onto the surface of the wafer 10 at an oblique angle θ of 20 to 40 degrees, preferably 30 degrees, which provides an optimal blowing force of the gas towards the surface of the wafer 10.

Since the gas is blown towards the surface of the wafer 10 by the blowing section 20, any particles formed by the marking process can be effectively removed from the surface of the wafer 10 while the marking process is being carried out. The blowing section 20 begins to blow the gas after the laser beam is activated and radiated, and continues blowing the gas for a predetermined time after the radiation of the laser beam has been deactivated.

The gas blown towards the surface on the wafer 10 must not change the physical and chemical features of the wafer 10, and therefore, the gas is preferably comprised of air, nitrogen gas, or a mixture thereof.

Figure 4:
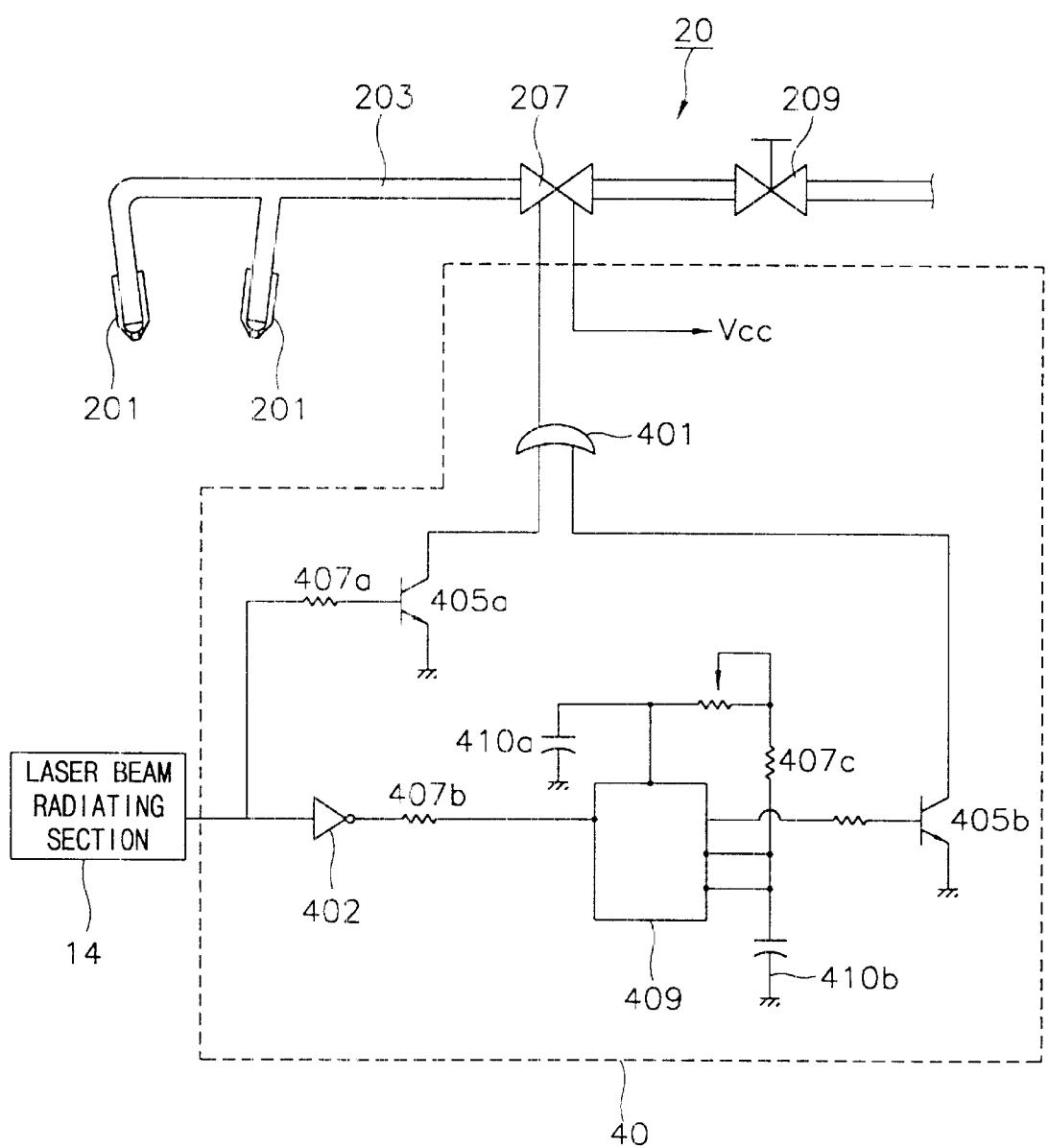
FIG. 4 is a circuit diagram showing a method for controlling a gas blowing operation of the apparatus for marking the identification mark on the wafer according to the embodiment of the present invention.

FIG. 4 is a circuit diagram showing the method for controlling the blowing operation of the marking apparatus according to an embodiment of the present invention. In FIG. 4, an adjusting valve 209 (for adjusting the amount of gas provided to pipe 203 from the blower motor 205), and a solenoid valve 207 are provided in the blowing section 20. The solenoid valve 207 controls the activation or deactivation of the blowing of the gas, and the adjusting valve 209 controls the flow rate of the gas. The solenoid valve 207 controls the blowing of the gas based on the intensity of the power applied to the laser beam radiating section 14. Accordingly, a control section 40 for controlling the solenoid valve 207 is positioned between the solenoid valve 207 and the laser beam radiating section 14.

The control section 40 is comprised of an OR gate 401, a NOT gate 402, an IC device 409, N-type transistors 405a and 405b, a plurality of resistors 407a, 407b and 407c, and charging members 410a and 410b. When the power is applied to the laser beam radiating section 14, a power applying signal is transmitted to the control section 40. The power applying signal is then transmitted to the OR gate 401 so as to turn on the transistor 405a through the resistor 407a so that the solenoid valve 207 is opened (i.e., activated) and the gas blows towards the wafer 10. This ensures that when the laser beam is radiated on the wafer 10, the gas blows towards the wafer 10.

When the power applied to the laser beam radiating section 14 is deactivated, a power deactivating signal is transmitted to the NOT gate 402. The power deactivating signal is transformed into a power applying signal by the NOT gate 402 and is transmitted into the IC device 409 through the resistor 407b. Accordingly, the transistor 405b is turned on and the solenoid valve 207 is opened (or remains activated), so that the gas continuously blows towards the wafer 10 after the power applied to the laser beam radiating section 14 has been deactivated. The signal for keeping the solenoid valve 207 open is maintained for a predetermined period of time, for example three seconds, by means of the resistor 407c connected to the IC device 409. More specifically, the gas blows towards the surface of the wafer 10 even when the radiation of the laser beam has been deactivated, and the timing for continually blowing the gas after the laser is deactivated can be controlled by means of the resistor 407c.

By blowing the gas towards the surface of the wafer 10, the particles created on the surface on the wafer 10 caused by the radiation of the laser beam are effectively removed. The particles removed from the surface of the wafer 10 are mixed in with the gas, and therefore, the gas including the particles are preferably collected and exhausted.

Figure 5:
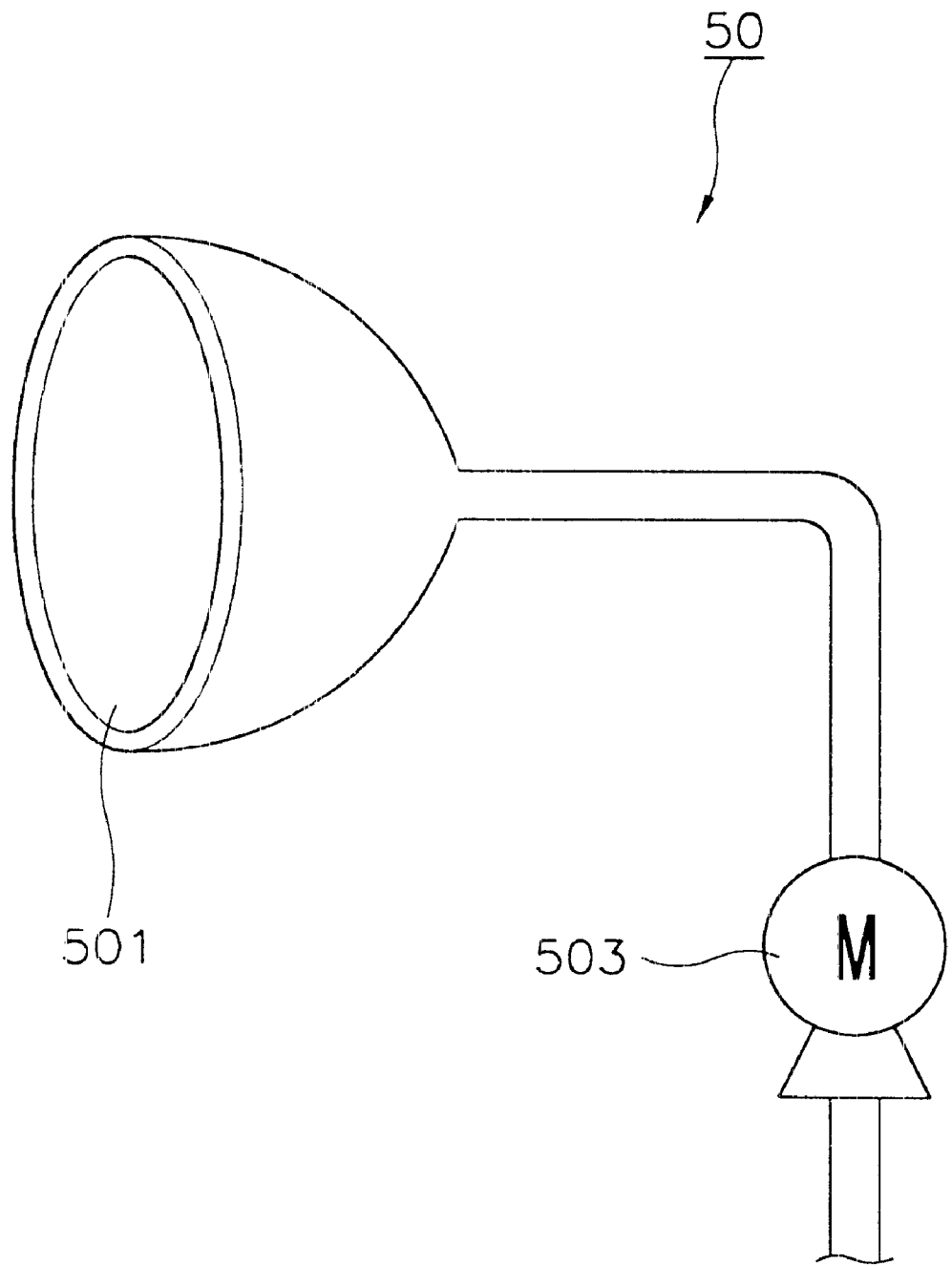
FIG. 5 is a side view showing a collecting and exhausting section of FIG. 1.

FIG. 5 shows a collecting and exhausting section 50 for collecting and exhausting the gas including the particles mixed therein. In FIG. 5, the collecting and exhausting section 50 has a cone-shaped end portion 501 which is positioned adjacent to the surface of the wafer 10, and opposite to the flow direction of the nozzles 201 of the blowing section 20. The collecting and exhausting section 50 includes a suction member 503 for providing the suction force for exhausting the gas. The suction member 503 is comprised of a fan, for example. Accordingly, the gas, which is mixed with the particles removed from the surface of the wafer 10, is first collected in the cone-shaped end portion 501 and then exhausted to the exterior by the collecting and exhausting section 50. In addition, the collecting and exhausting section 50 continuously operates the suction member 503 while the gas is being blown by the blowing section 20, thereby continuously exhausting the gas and particles. The control section 40, which controls the solenoid valve 207 of the blowing section 20, may also be connected to the collecting and exhausting section 50 as shown in FIG. 1, using a suitable means (such as that shown in FIG. 4) for activating and deactivating the collecting and exhausting section 50 in response to the activation or deactivation of the laser.

In operation, the particles created on the surface of the wafer 10 when the identification mark is engraved on the wafer 10 by the laser beam radiating section 14 can be removed by blowing the gas towards the surface of the wafer 10, and then the gas mixed with the particles is collected and exhausted by the collecting and exhausting section 50, so that the particles are prevented from sticking to the surface of the wafer 10.

Figure 6:
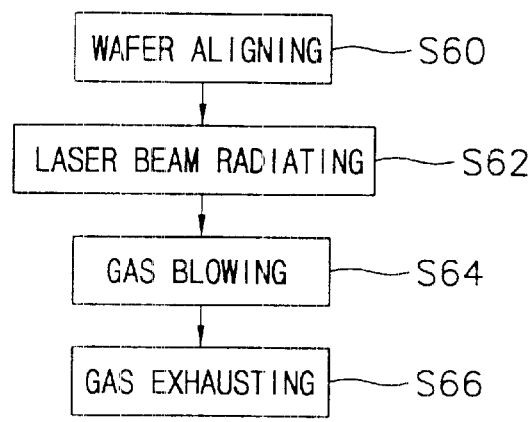
FIG. 6 is a flow-chart for illustrating a method for marking the identification mark on the wafer according to the embodiment of the present invention.

FIG. 6 is a flow chart showing the method for marking the identification mark on the wafer 10 according to the embodiment of the present invention. Before the unit processes are carried out, the wafer 10 (know as a 'bare wafer' since no patterns are formed thereon) is prepared. The wafer 10 is conveyed to the supporter 12 by means of the robot arm or other suitable conventional conveying device. Then, the supporter 12 rotates so as to align the wafer 10 thereon in such a manner that a predetermined portion of the wafer 10, to which the identification mark is engraved, can be matched with the laser beam radiating section 14 (step 360). The predetermined portion of the wafer 10 may be a flat zone or a peripheral portion of the wafer 10.

Figure 7:
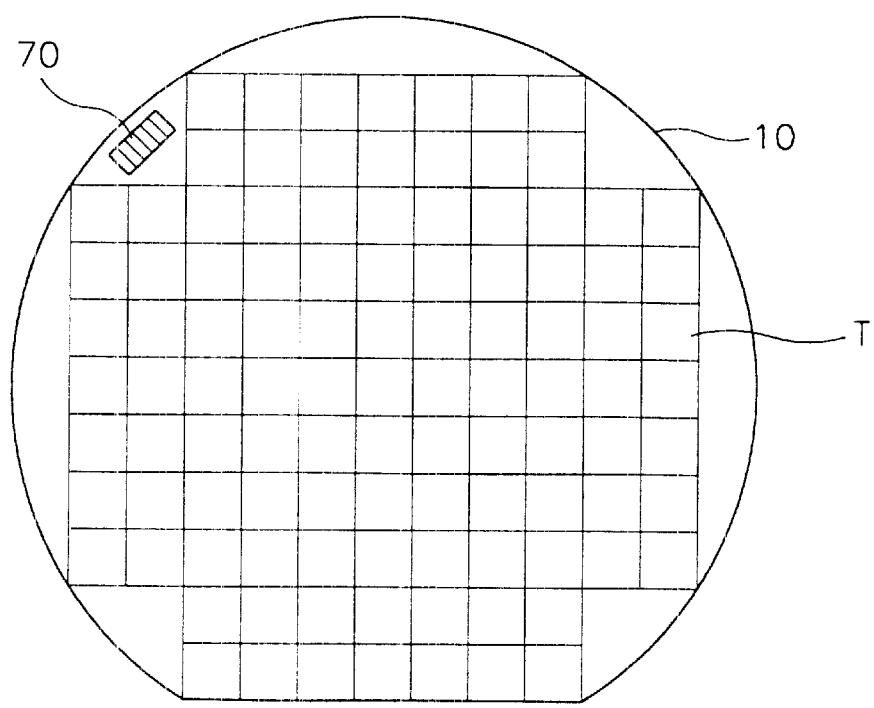
FIG. 7 is a plan view showing the identification mark marked on a predetermined portion of the wafer.

FIG. 7 shows the predetermined portion of the wafer 10 to which the identification mark 70 is formed. In FIG. 7, the predetermined portion for engraving the identification mark 70 is the peripheral portion of the wafer 10 where no patterns are formed. In FIG. 7, an area T represents an area where the pattern is formed.

If the position of the laser beam radiating section 14 is pre-set, the supporter 12 is rotated so as to match the predetermined portion on the wafer 10 with the laser beam radiating section 14. However, it is also possible to move the laser beam radiating section 14 so as to match with the predetermined portion of the wafer 10. In step S60, the supporter 12 is rotated so as to align the wafer 10.

Then, the laser beam is radiated onto the peripheral portion of the wafer 10 so as to engrave the identification mark 70 on the peripheral portion of the wafer 10 (step S62). The laser beam melts the peripheral portion of the wafer 10 so that the identification mark 70 is formed on the peripheral portion on the wafer 10. The melting process causes particles to be created on the peripheral portion on the wafer 10. At the same time, gas blows towards the peripheral portion on the wafer 10 (as described with regard to FIGS. 2–4) so as to remove the particles from the peripheral portion of the wafer 10 (step S64). The blowing of the gas is controlled based on the power applied to the laser beam radiating section 14. Therefore, the gas blows towards the predetermined portion when the laser beam is radiated onto the predetermined portion of the wafer 10. The gas keeps on blowing for three seconds, or some other interval selected by the operator, after the radiation of the laser beam has been deactivated. By activating (opening) or deactivating (closing) the solenoid valve 207 of the blowing section 20, the blowing of the gas is controlled and the switching of the solenoid valve 207 is controlled based on the power applied to the laser beam radiating section 14. The power is simultaneously applied to both the laser beam radiating section 14 and the control section 40, and the control section 40 controls the switching of the solenoid valve 207 based on the power signal.

While the laser beam is being radiated, the gas including the particles removed from the peripheral portion of the wafer 10 is collected and exhausted (step S66). At this time, the gas is exhausted to the exterior through the collecting and exhausting section 50.

By blowing and exhausting the gas while the marking operation is being carried out, the particles created on the wafer 10 by the radiation of the laser beam can be effectively removed.

The inventors of the present invention measured the number of particles that apparatus on the wafer 10 before and after the marking operation by the conventional marking marking apparatus of the present invention. The results are shown in tables 1 and 2.

TABLE 1

Number of Particles Measured on the Wafer Before and After the Marking Operation is Performed Using a Conventional Marking Apparatus

| Wafer No. | Number of Particles (before marking operation) | Number of Particles (after marking operation) |
| --- | --- | --- |
| 1 | 10 | 204 |
| 2 | 16 | 214 |
| 3 | 15 | 51 |
| 4 | 21 | 230 |
| 5 | 16 | 236 |
| 6 | 11 | 110 |
| 7 | 14 | 196 |
| 8 | 10 | 208 |
| 9 | 22 | 231 |
| 10 | 14 | 204 |

The number of particles was measured using a Tenco 6200 particle measuring device which can measure particles having a diameter of 0.16 $\mu$m. Ten wafers were measured. The average number of particles that existed on the wafer before the marking operation was 15, and the average number of particles that existed on the wafer after the marking operation was 188. As noted from the Table 1, the average number of particles eased by 173 after the marking operation had been carried out.

TABLE 2

Number of Particles Measured on the Wafer Before and After Marking Operation is Performed by Marking Apparatus of Present Invention

| Wafer No. | Number of particles before M.O. | Number of particles After M.O. | Wafer No. | Number of particles before M.O. | Number of particles After M.O. |
| --- | --- | --- | --- | --- | --- |
| 1 | 31 | 31 | 18 | 28 | 42 |
| 2 | 33 | 41 | 19 | 38 | 43 |
| 3 | 795 | 797 | 20 | 3 | 25 |
| 4 | 91 | 68 | 21 | 24 | 26 |
| 5 | 22 | 29 | 22 | 28 | 41 |
| 6 | 38 | 46 | 23 | 63 | 82 |
| 7 | 30 | 31 | 24 | 46 | 57 |
| 8 | 47 | 50 | 25 | 31 | 43 |
| 9 | 51 | 55 | 26 | 28 | 40 |
| 10 | 81 | 81 | 27 | 16 | 27 |
| 11 | 9 | 11 | 28 | 12 | 31 |
| 12 | 73 | 84 | 29 | 21 | 33 |
| 13 | 12 | 27 | 30 | 10 | 25 |
| 14 | 18 | 36 | 31 | 31 | 36 |
| 15 | 16 | 37 | 32 | 4 | 11 |
| 16 | 68 | 86 | 33 | 49 | 63 |
| 17 | 5 | 19 | 34 | 14 | 39 |

The number of particles was measured using an SP1 particle measuring device measure particles having a diameter of 0.13 $\mu$m. Thirty four wafers were and the average number of particles that existed on the wafer before the operation was 32, and the average number of particles that existed on the wafer marking operation was 42. As noted from the Table 2, the average number of as increased by just 10 after the marking operation has been carried out.

As can be seen, the marking apparatus of the present invention can greatly reduce the number of particles as compared with the conventional marking apparatus. In addition, since the present invention uses the SP1 particle measuring device which can measure finer (0.13 $\mu$m) particles as compared with the Tenco 6200 particle measuring device (0.16 $\mu$m), the real number of particles to be reduced is greater than the measured number of the particles.

Accordingly, the marking apparatus of the present invention having the blowing section and the collecting/exhausting section can effectively remove the particles created on the wafer during the marking operation.

As mentioned above, according to the present invention, the particles created on the wafer are effectively removed from the wafer by blowing the gas towards the wafer while the laser beam is being radiated on the wafer for engraving the identification mark on the wafer. Therefore, the particles are prevented from sticking to the surface of the wafer, so that the failure of the wafer caused by the particles can be prevented while the subsequent unit processes are carried out. Accordingly, the present invention can improve the reliability of the semiconductor device.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. A method for marking an identification mark on a wafer comprising:
   providing a laser beam radiating section that radiates a laser beam when activated;
   engraving a wafer identification mark onto a predetermined portion of the wafer by radiating the laser beam onto the predetermined portion of the wafer;
   generating signals corresponding to the intensity of power applied to activate the laser beam radiating section;
   producing a flow of gas in a blowing section for use in blowing particles away from a surface of the wafer;
   when the generated signals are indicative of an intensity of power being applied to the laser beam radiating section, controlling the blowing section in response to the signals to blow the gas in a flow direction towards the predetermined portion of the wafer so as to blow particles away from the surface of the wafer while the laser beam is being radiated; and
   when the generated signals are indicative of the laser beam radiating section being deactivated, controlling the blowing section in response to the signals to interrupt the flow of gas towards the wafer.

2. The method as claimed in claim 1, further comprising collecting and exhausting the gas, which is mixed with the particles generated during the engraving and blowing steps.

3. The method as claimed in claim 1, wherein during the engraving, the predetermined portion of the wafer is the flat zone of the wafer.

4. The method as claimed in claim 1, wherein during the engraving, the predetermined portion of the wafer is a peripheral portion of the wafer on which a pattern is not formed.

5. The method as claimed in claim 1, wherein said engraving comprises operating an Nd/YAG laser in a dot matrix mode to engrave the wafer identification mark.

6. The method as claimed in claim 5, wherein the Nd/YAG laser has a wavelength of 1064 nm.

7. The method as claimed in claim 2, wherein said controlling the blowing section to interrupt the flow of gas comprises allowing the blowing section to blow the gas towards the wafer for a designated time period after the laser beam radiating section has been deactivated, and
   further comprising continuing the collecting and exhausting processes during said designated time period.

8. The method as claimed in claim 7, wherein the designated time period is about three seconds after the laser beam radiating section has been deactivated.

9. The method as claimed in claim 1, wherein during the blowing, further comprising selecting one gas from the group consisting of air, nitrogen gas, and a mixture thereof.

10. The method as claimed in claim 1, wherein said flow direction is at an oblique angle of about 20 to 40 degrees relative to the surface of the wafer.

11. The method as claimed in claim 1, wherein said flow direction is at an oblique angle of about 30 degrees relative to the surface of the wafer.

12. The method as claimed in claim 1, wherein said controlling of the blowing section comprises operating a solenoid valve provided in a gas flow line of the blowing section.

13. An apparatus for marking a wafer identification mark on a wafer, the apparatus comprising:
   a supporting section for receiving and supporting the wafer;
   a laser beam radiating section for engraving the wafer identification mark onto a predetermined portion of a wafer, supported by the supporting section, to identify the wafer;
   a blowing section for blowing a gas in a flow direction towards the predetermined portion of the wafer while the laser beam is being radiated so as to remove particles created on a surface of the wafer by radiating the laser beam, an end of the blowing section being positioned adjacent to the surface of the wafer, and the blowing section comprising a solenoid valve for activating and deactivating the blowing of the gas; and
   a control section electrically connected to the laser beam radiating section and the blowing section, wherein the control section operatively receives intensity data corresponding to a power applied to the laser beam radiating section, and wherein the control section controls activating and deactivating states of the solenoid valve based on the intensity data of the power.

14. The apparatus as claimed in claim 13, wherein said control section is electronically configured to activate the solenoid valve when the power is applied to the laser beam radiating section and to deactivate the solenoid valve after a predetermined times lapses after the power applied to the laser beam radiating section is deactivated.

15. An apparatus for marking a wafer identification mark on a wafer, the apparatus comprising:
   a supporting section for receiving and supporting the wafer;
   a laser beam radiating section for engraving the wafer identification mark onto a predetermined portion of a wafer, supported by the supporting section, to identify the wafer;
   a blowing section for blowing a gas in a flow direction towards the predetermined portion of the wafer while the laser beam is being radiated so as to remove particles created on a surface of the wafer by the laser beam, an end of the blowing section being positioned adjacent to the surface of the wafer; and
   a collecting and exhausting section for collecting and exhausting a gas including the particles while the laser beam is being radiated, the collecting and exhausting section having a cone-shaped end portion which is positioned adjacent to the surface of the wafer opposite to the flow direction along which the gas is blown by the blowing section, and another end comprising a suction device providing a suction force for forcibly exhausting the gas.

16. The apparatus as claimed of claim 15, wherein the suction device is a fan.

17. The apparatus as claimed in claim 15, wherein the laser beam radiating section includes an Nd/YAG laser operating in a dot matrix mode.

18. The apparatus as claimed in claim 17, wherein the Nd/YAG laser has a wavelength of 1064 nm.

19. The apparatus as claimed in claim 15, wherein the end of the blowing section comprises a nozzle oriented along the flow direction and positioned at an oblique angle of about 20 to 40 degrees relative to a wafer support surface of said supporting section, wherein the gas will flow though the nozzle at an oblique angle of about 20 to 40 degrees relative to the surface of a wafer received and supported on said support surface.

* * * * *